United States Patent
Guan

(10) Patent No.: US 11,805,623 B2
(45) Date of Patent: Oct. 31, 2023

(54) HEAT DISSIPATION SYSTEM AND METHOD

(71) Applicant: Lenovo (Beijing) Co., Ltd., Beijing (CN)

(72) Inventor: Minghui Guan, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 17/207,296

(22) Filed: Mar. 19, 2021

(65) Prior Publication Data

US 2021/0307203 A1 Sep. 30, 2021

(30) Foreign Application Priority Data

Mar. 31, 2020 (CN) .......................... 202010245480.3

(51) Int. Cl.
*F28F 7/00* (2006.01)
*H05K 7/20* (2006.01)

(52) U.S. Cl.
CPC ................ *H05K 7/20381* (2013.01)

(58) Field of Classification Search
CPC ............................ H05K 7/203; H05K 7/20381
USPC ............................................. 165/80.4
See application file for complete search history.

(56) References Cited

U.S. PATENT DOCUMENTS

| | | | | |
|---|---|---|---|---|
| 9,408,332 | B2 * | 8/2016 | Smith | H05K 7/203 |
| 10,405,459 | B2 * | 9/2019 | Campbell | H05K 7/203 |
| 2019/0265154 | A1 | 8/2019 | Rudmann et al. | |

FOREIGN PATENT DOCUMENTS

| | | |
|---|---|---|
| CN | 104519722 A | 4/2015 |
| CN | 204968334 U | 1/2016 |
| CN | 107885294 A | 4/2018 |
| CN | 109618538 A | 4/2019 |
| CN | 110297530 A | 10/2019 |
| CN | 110868839 A | 3/2020 |

\* cited by examiner

*Primary Examiner* — Davis D Hwu
(74) *Attorney, Agent, or Firm* — ANOVA LAW GROUP, PLLC

(57) ABSTRACT

A heat dissipation system includes an accommodation device, a collection device, and a control device. The accommodation device stores a first liquid. The first liquid converts to a first gas when satisfying a first temperature condition. An electronic apparatus is arranged in the first liquid, the first liquid doe not affect an operation of the electronic apparatus and converts to the first gas through heat generated by the electronic apparatus. The first temperature condition changes as an air pressure in the accommodation device changes. The collection device is configured to collect a parameter that indicates the air pressure in the accommodation device. The control device is configured to determine and execute a control instruction according to the parameter. The control instruction includes an instruction used to adjust the air pressure in the accommodation device.

18 Claims, 4 Drawing Sheets

HEAT DISSIPATION SYSTEM AND METHOD

CROSS-REFERENCE TO RELATED APPLICATION

This application claims priority to Chinese Patent Application No. 202010245480.3, filed on Mar. 31, 2020, the entire content of which is incorporated herein by reference.

TECHNICAL FIELD

The present disclosure generally relates to a heat dissipation system and method.

BACKGROUND

In an immersion phase-change liquid cooling device, a heat-generating component, such as a server, a CPU, etc., is directly immersed in cooling liquid. The cooling device includes an accommodation device, an electronic apparatus, and a first liquid.

The accommodation device includes a sealed chamber, which is configured to store the first liquid. When the electronic apparatus generates heat, the temperature of the first liquid rises. When the temperature of the first liquid rises to a boiling point, a phase of the first liquid changes. The first liquid changes from a liquid state to a gas state. The heat is absorbed through the vaporization of the first liquid.

During the above process, since the first liquid absorbs the heat and changes into a gas, air pressure in the accommodation device is dynamically changing. Change of the air pressure will affect the boiling point of the first liquid to affect the efficiency of the heat transfer.

SUMMARY

Embodiments of the present disclosure provide a heat dissipation system including an accommodation device, a collection device, and a control device. The accommodation device stores a first liquid. The first liquid converts to a first gas when satisfying a first temperature condition. An electronic apparatus is arranged in the first liquid, the first liquid does not affect an operation of the electronic apparatus and converts to the first gas through heat generated by the electronic apparatus. The first temperature condition changes as an air pressure in the accommodation device changes. The collection device is configured to collect a parameter that indicates the air pressure in the accommodation device. The control device is configured to determine and execute a control instruction according to the parameter. The control instruction includes an instruction used to adjust the air pressure in the accommodation device.

Embodiments of the present disclosure provide a heat dissipation method. The method includes collecting a parameter of an air pressure in an accommodation device and determining and executing a control instruction according to the parameter to adjust the air pressure in the accommodation device. The accommodation device is configured to store a first liquid. The first liquid converts to a first gas in response to satisfying a first temperature condition. If an electronic apparatus is arranged in the first liquid, the first liquid does not affect an operation of the electronic apparatus and converts to the first gas through heat generated by the electronic apparatus. The first temperature condition changes as the air pressure in the accommodation device changes.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION OF THE EMBODIMENTS

Embodiments of the present disclosure are described in detail in connection with the accompanying drawings below. Described embodiments are merely some embodiments of the present disclosure but not all embodiments. Based on embodiments of the present disclosure, all other embodiments obtained by those of ordinary skill in the art without creative effort should be within the scope of the present disclosure.

Figure 1:
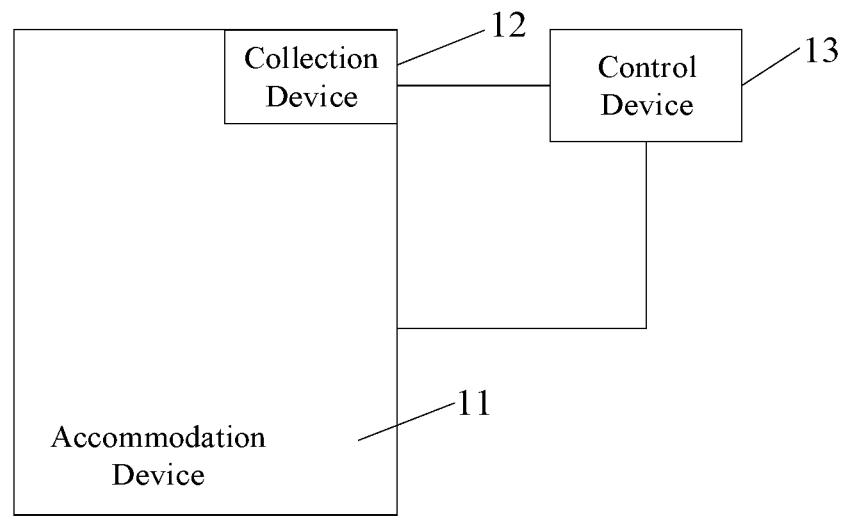
FIG. 1 illustrates a schematic structural diagram of a heat dissipation system according to some embodiments of the present disclosure.

Embodiments of the present disclosure provide a heat dissipation system, which has a structure shown in FIG. 1. The heat dissipation system includes an accommodation device 11, a collection device 12, and a control device 13.

The accommodation device 11 may store a first liquid. The first liquid may change into a first gas when the temperature of the first liquid satisfies a first temperature condition. If the electronic apparatus is arranged in the first liquid, the first liquid does not affect the operation of the electronic apparatus. The first liquid may change into the first gas by absorbing heat generated by the electronic apparatus during operation. The first temperature condition may change as the air pressure in the accommodation device changes.

The collection device 12 may be configured to collect a parameter indicating the air pressure in the accommodation device.

The control device 13 may be configured to determine and execute a control instruction according to the parameter. The control instruction may include an instruction used to adjust the air pressure in the accommodation device.

The electronic apparatus may be an apparatus that needs to dissipate the heat. The electronic apparatus may be arranged in the first liquid. The first liquid does not affect the normal operation of the electronic apparatus. In some embodiments, the first liquid may have an insulation property and may not affect the electronic apparatus. In some other embodiments, the electronic apparatus includes a sealed housing. The sealed housing may block the first liquid from entering the electronic apparatus. Thus, the first liquid may not contact the electronic apparatus.

The first liquid may change into the first gas when the temperature of the first liquid satisfying the first temperature condition. The first temperature condition may change as the air pressure in the accommodation device changes. That is, when the air pressure in the accommodation device changes, the first temperature condition changes. For example, when the air pressure of the accommodation device is first air pressure, the first liquid may convert to the first gas at a first temperature. When the air pressure of the accommodation device is second air pressure, the first liquid may convert to the first gas at a second temperature. The first temperature and the second temperature are the first temperature conditions under different air pressure conditions.

The accommodation device may store the first liquid. The accommodation device may include a sealed chamber or an opening. The accommodation device may be connected to and sealed from the outside through the opening. Thus, after changing into the first gas in the accommodation device, the first liquid may not be exhausted but may be still in the sealed space where the accommodation device is located.

Figure 2:
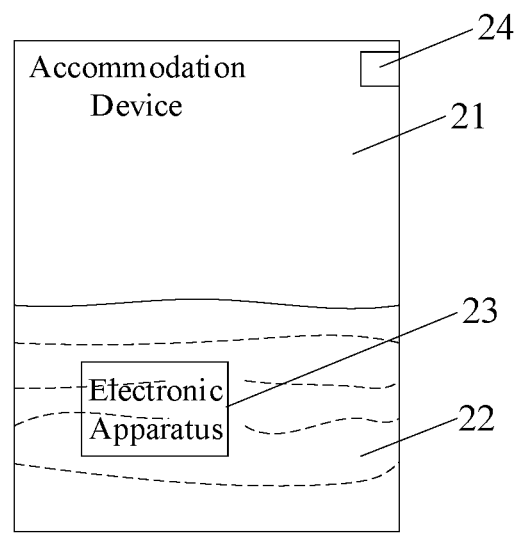
FIG. 2 illustrates a schematic structural diagram of a heat dissipation system according to some embodiments of the present disclosure.

An electronic apparatus is arranged in a first liquid. As shown in FIG. 2, a heat dissipation system includes an accommodation device 21, a first liquid 22, an electronic apparatus 23, and a collection device 24.

If the temperature of the electronic apparatus that needs heat dissipation is relatively high, the first liquid may reach the first temperature condition under corresponding air pressure, the first liquid may convert to the first gas. That is, the first liquid may convert to the first gas through the heat generated by the electronic apparatus during operation. After converting to the first gas, the first liquid may absorb the heat generated by the electronic apparatus during operation to lower the temperature of the electronic apparatus to dissipate the heat of the electronic apparatus.

The collection device may be configured to collect the parameter that indicates the air pressure in the accommodation device. Thus, a control device may determine the change of the air pressure in the accommodation device based on the collected parameter. The control device may determine and execute the control instruction to adjust the air pressure in the accommodation device.

By adjusting the air pressure in the accommodation device, the first temperature condition may be changed, and the efficiency of the first liquid converting to the first liquid may be changed. Thus, the efficiency of the heat dissipation of the electronic apparatus may be ensured. For example, by increasing the air pressure in the accommodation device, the boiling point of the first liquid converting to the gas may be increased in the first temperature condition. Thus, when converting to the first gas, the first liquid may absorb more heat from the electronic apparatus to increase the efficiency of the heat dissipation. By decreasing the air pressure in the accommodation device, the boiling point of the first liquid converting to the gas may be lowered in the first temperature condition. Thus, when converting to the first gas, the first liquid may absorb less heat from the electronic apparatus to decrease the efficiency of the heat dissipation.

The dissipation system of embodiments of the present disclosure includes the accommodation device, the collection device, and the control device. The accommodation device may store the first liquid. The first liquid may convert to the first gas by satisfying the first temperature condition. If the electronic apparatus is arranged in the first liquid, the first liquid may not affect the operation of the electronic apparatus. The first liquid may convert to the first gas through the heat generated by the electronic apparatus during operation. The first temperature condition may change as the air pressure in the accommodation device changes. The collection device may be configured to collect the parameter that indicates the air pressure in the accommodation device. The control device may be configured to determine and execute the control instruction according to the parameter. The control instruction may include the instruction used to adjust the air pressure in the accommodation device. The heat dissipation system disclosed in the present disclosure may adjust the change of the air pressure in the accommodation device by the control device. The first liquid stored in the accommodation device may absorb the heat of the electronic apparatus by arranging the electronic apparatus that needs the heat dissipation in the first liquid. Them, the first liquid may convert to the first gas to dissipate the heat of the electronic apparatus. Since the control device may be configured to adjust the air pressure in the accommodation device, the problem that the efficiency of the first liquid absorbing the heat to convert to the first gas due to the change of the air pressure in the accommodation device decreases may be avoided.

Figure 3:
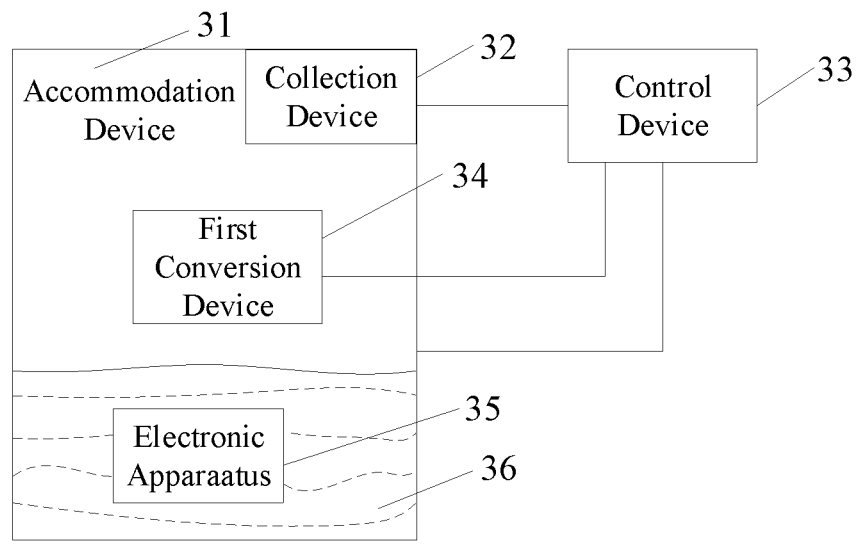
FIG. 3 illustrates a schematic structural diagram of a heat dissipation system according to some embodiments of the present disclosure.

As shown in FIG. 3, the heat dissipation system of embodiments of the present disclosure includes an accommodation device 31, a collection device 32, a control device 33, and a first conversion device 34.

In addition to the same structure as above embodiments, the heat dissipation system includes the first conversion device 34 additionally.

The first conversion device 34 is arranged in the accommodation device and may be configured to generate the temperature that satisfies a second temperature condition.

The first gas may convert to the first liquid by satisfying the second temperature condition. Under the same air pressure, the second temperature condition may be of lower temperature than the first temperature condition. The second temperature condition may change as the air pressure in the accommodation device changes.

If getting close to or contacting the first conversion device that satisfies the second temperature condition, the first gas may convert to the first liquid.

When satisfying the first temperature condition, the first liquid may convert to the first gas. When satisfying the second temperature condition, the first gas may convert to the first liquid. Under the same air pressure condition, the second temperature condition may be of lower temperature than the first temperature condition. For example, under the first air pressure condition, the first liquid may convert to the first gas when reaching the first temperature, and the first gas may convert to the first liquid when reaching the second temperature. The second temperature is lower than the first temperature. Under the second air pressure condition, the first liquid may convert to the first gas when reaching a third temperature, and the first gas may convert to the first liquid when reaching a fourth temperature. The fourth temperature may be lower than the third temperature.

The electronic apparatus 35 is arranged in the first liquid. When reaching the first temperature condition by the heat generated during the operation of the electronic apparatus 35, the first liquid may convert to the first gas. As the first liquid converts to the first gas, the first liquid becomes less and less. To avoid this problem, the first conversion device, which is configured to cause the first gas to convert to the first liquid, is arranged in the accommodation device.

The first conversion device is arranged in the accommodation device. The first conversion device may be configured to cause the first gas to reach the second temperature condition. In some embodiments, the first conversion device causing the first gas to reach the second temperature condition includes the following process. The first conversion device may reach a certain temperature condition. When contacting the first conversion device, the first gas may reach the second temperature condition. In some other embodiments, the first conversion device may radiate a temperature satisfying a certain temperature condition. Thus, when getting close to the first conversion device, the first gas may reach the second temperature condition to convert to the first gas.

In some embodiments, the accommodation device may include a first side portion 36. The first side portion 36 may be a side portion covered by the first liquid after the accommodation device stores the first liquid. The first conversion device may be arranged away from the first side portion 36 and contactless from the first liquid.

The accommodation device may be configured to store the first liquid. Due to gravity, a side where the first liquid is located is a bottom side of the accommodation device. That is, a side where a bottom surface is located. Thus, after the accommodation device stores the first liquid, the first side portion covered by the first liquid may be at the side where the bottom surface of the accommodation device is located.

Since the first liquid absorbs the heat dissipated by the electronic apparatus to convert to the first gas, after the first liquid converts to the first gas, the first gas may move toward an upper portion of the accommodation device. The first conversion device may be configured to transform the first gas into the first liquid. Thus, the first conversion device may not need to contact the first liquid and may be arranged at the upper portion of the accommodation device, that is, a position away from the first side portion.

Figure 4:
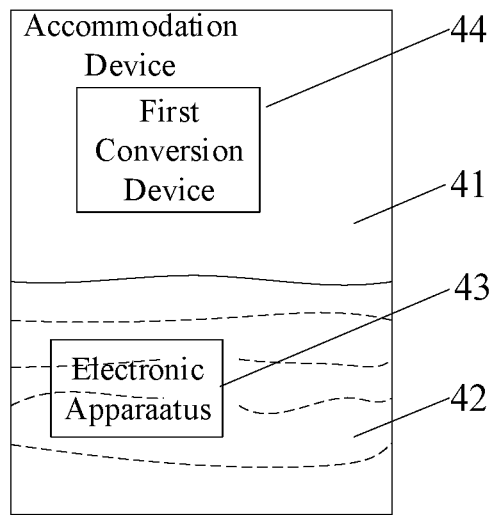
FIG. 4 illustrates a schematic structural diagram of a heat dissipation system according to some embodiments of the present disclosure.

As shown in FIG. 4, a heat dissipation system includes an accommodation device 41, a first liquid 42, an electronic apparatus 43, and a first conversion device 44. The first liquid is located at the bottom of the accommodation device. The first conversion device is located at a position of an upper portion of the accommodation device.

The first liquid is located at the bottom of the accommodation device due to gravity. The first gas that is formed after the first liquid satisfies the first temperature condition may move toward an opposite direction of the gravity direction, that is, toward the first conversion device. The first gas may convert to the first liquid after getting close to or contact the first conversion device, which satisfies the second temperature condition. The first gas may be transformed into the first liquid and move toward the first side portion. That is, the first liquid may drop to the bottom of the accommodation device due to gravity.

The heat dissipation system of embodiments of the present disclosure includes the accommodation device, the collection device, and the control device. The accommodation device may store the first liquid. The first liquid may convert to the first gas when satisfying the first temperature condition. The electronic apparatus may be arranged in the first liquid. The first liquid may not affect the operation of the electronic apparatus and may convert to the first gas through the heat generated by the electronic apparatus during operation. The first temperature condition may change as the air pressure in the accommodation device changes. The collection device may be configured to collect the parameter that indicates the air pressure in the accommodation device. The control device may be configured to determine and execute the control instruction according to the parameter. The control instruction may include the instruction used to adjust the air pressure in the accommodation device. The heat dissipation system of embodiments of the present disclosure may adjust the change of the air pressure in the accommodation device through the control device. The accommodation device stores the first liquid. By arranging the electronic apparatus that needs the heat dissipation in the first liquid, the first liquid may absorb the heat of the electronic apparatus to convert to the first gas. Thus, the heat of the electronic apparatus may be dissipated. Since the control device may be configured to adjust the air pressure in the accommodation device, the problem that the efficiency of the first liquid absorbing the heat to convert to the first gas due to the change of the air pressure in the accommodation device decreases may be avoided. Thus, the efficiency of the heat transfer may be ensured.

Figure 5:
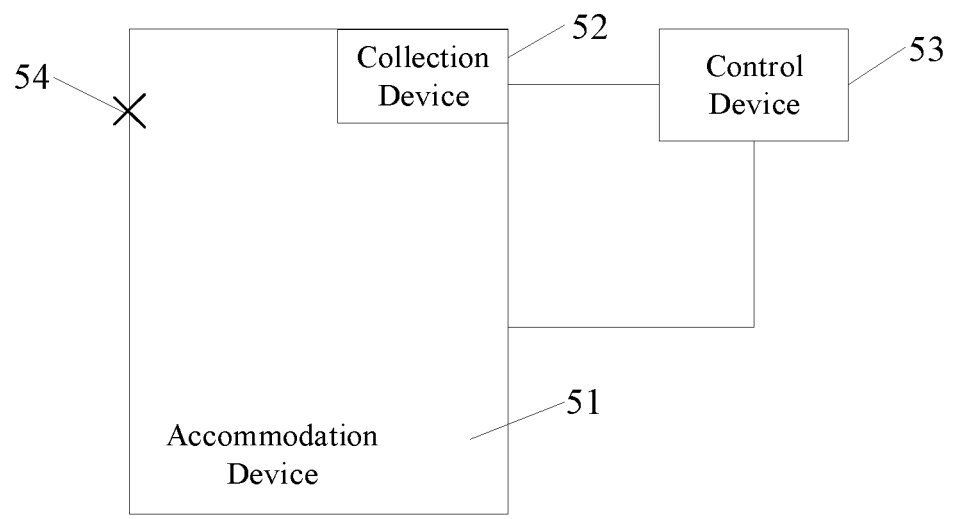
FIG. 5 illustrates a schematic structural diagram of a heat dissipation system according to some embodiments of the present disclosure.

Embodiments of the present disclosure provide a heat dissipation system, which has a structure shown in FIG. 5. The heat dissipation system includes an accommodation device 51, a collection device 52, a control device 53, and a valve 54.

In addition to the same structure as above embodiments, the heat dissipation system includes the valve 54 additionally.

The accommodation device 51 may include a first opening. The first opening may be arranged away from the first side portion. The valve 54 may be arranged at a position of the first opening. The valve may include a first state and a second state. In the first state, the accommodation device may include a sealed chamber. In the second state, the accommodation space of the accommodation device may be connected to an external space through the first opening.

The control device 53 may be configured to determine and execute the control instruction to control the valve according to the parameter.

If the air pressure of the accommodation space is higher than a target air pressure, the control device may control the valve to be in the second state to cause the first gas inside the accommodation space to be exhausted through the first opening. If the air pressure of the accommodation space is lower than the target air pressure, the control device may control the value to be in the second state. Thus, the second gas may be added from the external space into the accommodation space through the first opening.

The accommodation device may include the first opening. The first opening may cause the accommodation space of the accommodation device to communicate with the external space. The first opening may be configured to exchange, exhaust, or fill the gas of the sealed space. Since the first gas transformed from the first liquid moves to a side opposite to the gravity, that is, the upper portion of the accommodation device, the first opening may need to be arranged at the side opposite to the gravity of the accommodation device, that is, away from the first side portion. The first opening may be arranged at a certain position of the accommodation device away from the first side portion.

The valve may be arranged at the position of the first opening. When the valve is in the first state, that is, the valve is closed, the accommodation space of the accommodation device may be a sealed chamber. When the valve is in the second state, that is, the valve is opened, the accommodation space may communicate with the external space through the first opening.

When the air pressure in the accommodation space does not need to be adjusted, that is, when the control device determines that the parameter detected by the collection device indicates that the air pressure of the accommodation space satisfying the target air pressure, the valve may be in the first state. Thus, the accommodation space may maintain a sealed state.

When collecting the parameter of the air pressure in the accommodation space, the collection device transmits the parameter to the control device. The control device may be configured to adjust the air pressure in the accommodation space based on the parameter. In some embodiments, the control device may be configured to adjust the air pressure in the accommodation space by turning the valve on or off.

In some embodiments, the collection device may detect the parameter that indicates the air pressure in the accommodation space. The control device may be configured to compare the parameter to the target air pressure based on the parameter. If the parameter is determined to be greater than the target air pressure, the air pressure in the current accommodation space may be larger. The boiling point of the first liquid in the accommodation space may rise, that is, the first temperature condition may become higher. The efficiency of the first liquid absorbing the heat radiated during the operation of the electronic apparatus may be increased. Thus, the air pressure in the accommodation space may be lowered to decrease the first temperature condition to cause the air pressure in the accommodation space to match the target air pressure. The efficiency of the heat dissipation may be decreased to cause the efficiency of the heat dissipation to match the heat radiated by the electronic apparatus to prevent an explosion.

In addition, if the control device determines that the parameter is lower than the target air pressure, the air pressure in the current accommodation space may be lower. The boiling point of the first liquid in the accommodation space may be lowered, that is, the first temperature condition is lowered. The efficiency of the first liquid absorbing the heated radiated during the operation of the electronic apparatus may be decreased. Thus, the air pressure in the accommodation space may be increased to cause the air pressure in the accommodation space to match the target air pressure. Thus, the first temperature condition may be increased to increase the efficiency of the heat dissipation to cause the efficiency of the heat dissipation to match the heat radiated by the electronic apparatus.

To decrease the air pressure in the accommodation space, the control device may need to control the valve to be turned on to cause the valve to be in the second state. Thus, the first gas in the accommodation space may be exhausted through the first opening. That is, the air pressure of the accommodation space may be increased, the gas in the accommodation space may be exhausted, and the air pressure may be then decreased.

To increase the air pressure in the accommodation space, the control device may need to control the valve to be turned on to cause the valve to be in the second state. Thus, second gas may be added from the external space into the accommodation space through the first opening. That is, the air pressure of the accommodation space may be decreased, the gas may be added into the accommodation space, and the air pressure in the accommodation space may be then increased.

The accommodation space may only include the first gas transformed from the first liquid or may include the first gas transformed from the first liquid and another gas that exists in the accommodation space, such as air. The second gas added to the accommodation space may be the same as or different from the first gas.

If the second gas is the same as the first gas, the heat dissipation system may further include a gas storage device.

The gas storage device may be configured to store the second gas that is exhausted from or to be added to the accommodation space through the first opening. That is, the external space from where the second gas is added into the accommodation space through the first opening may be the gas storage device. The first gas in the accommodation space may also be exhausted to the gas storage device through the first opening. The gas storage device may be only configured to store the gas. Thus, according to the needs of the accommodation space, the gas storage device may receive the exhaust gas or add the gas to the accommodation space.

If the second gas is different from the first gas, the second gas of an external environment may be added into the accommodation space through the first opening. The second gas may include air or another gas. No matter what gas is the second gas, the second gas will not react with the first gas.

In addition, if the second gas is different from the first gas, and the density of the second gas is smaller than the density of the first gas, the accommodation device may be fixed in the heat dissipation system, the first liquid may be at the bottom of the accommodation chamber, and the first opening may be arranged at the top of the sealed chamber. If the air pressure of the accommodation space is lower than the target air pressure, the control device may control the valve to be in the second state to cause the second gas to be added to the accommodation space and to be at the top of the accommodation space. If the air pressure of the accommodation space is higher than the target air pressure, the control device may control the valve to be in the second state to cause the second gas at the top of the accommodation space to be exhausted through the first opening.

Figure 6:
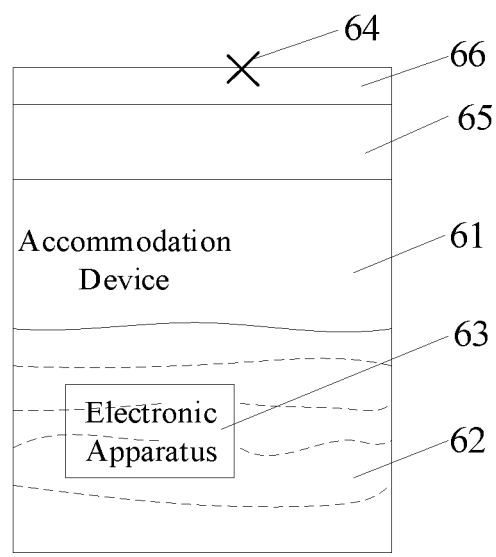
FIG. 6 illustrates a schematic structural diagram of a heat dissipation system according to some embodiments of the present disclosure.

The bottom of the accommodation chamber may be the side portion of the accommodation chamber where the first liquid is located due to gravity. The top of the accommodation chamber may be the side portion opposite to the bottom in the accommodation chamber where the first gas may move due to anti-gravity after the first liquid converts to the first gas. As shown in FIG. 6, a heat dissipation system includes an accommodation device 61, a first liquid 62, an electronic apparatus 63, a valve 64, a first gas 65, and a second gas 66.

The first gas and the second gas have different densities, and the density of the second gas is smaller than the density of the first gas. Thus, if the accommodation chamber includes both the first gas and the second gas, the second gas is located at the top of the accommodation chamber, and the first gas is located under the second gas.

After the first liquid absorbs the heat of the electronic apparatus to convert to the first gas, the first gas moves to the top of the accommodation chamber. If the accommodation chamber includes the second gas, the second gas may be located at the top of the accommodation chamber. Thus, the first gas transformed from the first liquid may be under the second gas and may not reach the top of the accommodation chamber. If the accommodation chamber does not include the second gas, the first gas transformed from the first liquid may directly reach the top of the accommodation chamber.

If the control device detects that the parameter indicating the air pressure collected by the collection device is lower than the target air pressure, that is, the air pressure of the accommodation space is lower than the target air pressure, the control device may control the valve to be turned on, that is, in the second state. The second gas may be added to the accommodation space. The first opening of the accommodation chamber may be arranged at the top of the accommodation chamber. The second gas may enter the accommodation space through the first opening to directly reach the top of the accommodation space. Since the density of the second gas is smaller than the density of the first gas, the second gas may be maintained at the top of the accommodation space, no matter whether there is the second gas in the accommodation space at the moment.

If the control device detects that the parameter is higher than the target air pressure, that is, the air pressure of the accommodation space is higher than the target air pressure, the control device may control the valve to be turned on, that is, in the second state. The gas in the accommodation space may be exhausted through the first opening. In some embodiments, if there is the second gas in the accommodation space at the moment, since the density of the second gas is smaller than the density of the first gas, and the first opening is arranged at the top of the accommodation space, when the gas is exhausted, the second gas may be exhausted at first. After the second gas is exhausted, the first gas in the accommodation space may be exhausted through the first opening, which may reduce the amount of the first gas that is exhausted. Thus, the loss of the first gas may be reduced, and transformation between the first gas and the first liquid may be ensured. If the air pressure of the accommodation space is higher than the target air pressure, and the accommodation space does not include the second gas, the first gas may be directly exhausted.

Further, the heat dissipation system of embodiments of the present disclosure further includes an air-flow control device.

The air-flow control device may be configured to exhaust the first gas of the accommodation space or add the second gas to the accommodation space.

The air-flow control device may control exhausting or adding the gas. That is, the air-flow control device may control the flow direction of the gas whether to flow into the accommodation space or flow from the accommodation space to the outside.

In addition, the air-flow control device may be further configured to control the speed of exhausting the gas from the accommodation space or the speed of adding the gas to the accommodation space.

In some embodiments, the air-flow control device may include a pump or a fan. The air-flow control device may be configured to control the speed of adding the gas or exhausting the gas.

Further, in some embodiments, the accommodation chamber may include one or two first openings.

In some embodiments, the accommodation chamber may include one first opening. The first gas in the accommodation space may be exhausted through the one first opening. In addition, the second gas may be added to the accommodation space through the one first opening. That is, both adding the gas to the accommodation space and exhausting the gas from the accommodation space may be realized through the one first opening. The less the opening the accommodation device is, the better the air sealability is.

If the accommodation chamber includes two first openings, the first gas in the accommodation space may be exhausted from one of the first openings, and the second gas may be added to the accommodation space from the other first opening. That is, the opening for exhausting the gas may be differentiated from the opening for adding the gas. Thus, when the second gas is different from the first gas, the gas that is exhausted and the gas that is added may be differentiated to ensure a single exhaust gas composition to reduce another component in the exhaust gas.

Further, the heat dissipation system of embodiments of the present disclosure further includes a second conversion device.

The second conversion device may be arranged at a channel connecting the accommodation space and the external space. The second conversion device may be configured to transform the first gas exhausted through the first opening from the accommodation space into a third gas that satisfies a gas emission condition.

Satisfying the gas emission condition may include a gas emission standard that does not pollute the environment. The second conversion device may be configured to transform the gas exhausted from the accommodation space to cause the third gas after the transformation to satisfy the gas emission condition. Thus, the third gas may not pollute the environment and harm the human body.

The second conversion device may be arranged at a channel of the exhaust gas of the accommodation space, that is, the channel connecting the accommodation space and the external space, for example, a side of the first opening that is not adjacent to the accommodation space. In some embodiments, the second conversion device may be arranged at a position of the channel of the exhaust gas adjacent to the external space. In some other embodiments, the second conversion device may be arranged at any position of the channel of the exhaust gas.

The heat dissipation system of embodiments of the present disclosure includes the accommodation device, the collection device, and the control device. The accommodation device stores the first liquid. The first liquid may convert to the first gas when satisfying the first temperature condition. The electronic apparatus may be arranged in the first liquid. The first liquid may not affect the operation of the electronic apparatus and may convert to the first gas through the heat generated by the electronic apparatus during operation. The first temperature condition may change as the air pressure in the accommodation device changes. The collection device may be configured to collect the parameter that indicates the air pressure in the accommodation device. The control device may be configured to determine and execute the control instruction according to the parameter. The control instruction may include the instruction used to adjust the air pressure in the accommodation device. The heat dissipation system of embodiments of the present disclosure may adjust the change of the air pressure in the accommodation device through the control device. The accommodation device stores the first liquid. By arranging the electronic apparatus that needs the heat dissipation in the first liquid, the first liquid may absorb the heat of the electronic apparatus to convert to the first gas. Thus, the heat of the electronic apparatus may be dissipated. Since the control device may be configured to adjust the air pressure in the accommodation device, the problem that the efficiency of the first liquid absorbing the heat to convert to the first gas due to the change of the air pressure in the accommodation device decreases may be avoided. Thus, the efficiency of the heat transfer may be ensured.

Embodiments of the present disclosure provide a heat dissipation system that includes an accommodation device, the collection device, the control device, and the first conversion device.

The accommodation device may include a sealed space. The control device may adjust the temperature of the first conversion device according to the parameter to adjust the first temperature condition and the second temperature condition.

If the accommodation device includes the sealed space, by adjusting the internal temperature of the sealed accommodation space, the efficiency of the first gas converting to the first liquid may change. The change of the efficiency of the first gas converting to the first liquid may cause the air pressure in the sealed accommodation space to change. When the air pressure in the sealed space changes, the first temperature condition and the second temperature condition may change as the air pressure changes. The change of the temperature conditions may further affect the transformation efficiency between the gas and the liquid to cause the air pressure in the sealed space to match the target air pressure.

The internal temperature of the sealed accommodation space may be adjusted by adjusting the temperature of the gas in the sealed accommodation space. The temperature of the gas in the accommodation space may be adjusted by adjusting the temperature of the first conversion device. Thus, the temperature of the first conversion device may be adjusted according to the parameter that indicates the air pressure of the accommodation space collected by the collection device. Then, the first temperature condition and the second temperature condition may be adjusted to adjust the air pressure in the accommodation space.

Further, the heat dissipation system of embodiments of the present disclosure further includes a second opening. The second opening may be arranged at a position away from the first side portion.

The first conversion device may include a first portion and a second portion. The first portion may be located inside the accommodation device. The second portion may be located outside of the accommodation device. The second portion may be sealed and communicate with the first portion through the second opening. The first conversion device may include a heat transfer medium. The heat transfer medium may be inside the first conversion device. The heat transfer medium may flow circularly between the first portion and the second portion to cause the first portion to match the second temperature condition.

Figure 7:
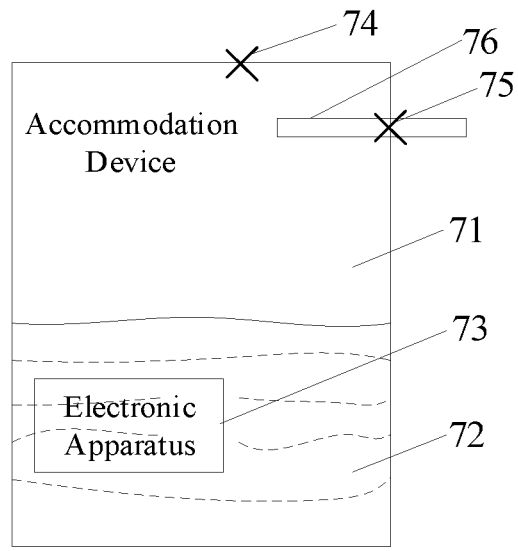
FIG. 7 illustrates a schematic structural diagram of a heat dissipation system according to some embodiments of the present disclosure.

FIG. 7 includes an accommodation device 71, a first liquid 72, an electronic apparatus 73, a first opening 74, a second opening 75, and a first conversion device 76.

The first conversion device may be arranged through the second opening. A portion of the first conversion device may be inside the accommodation device. A portion of the first conversion device may be outside of the accommodation device. The heat transfer medium inside the first conversion device may flow circularly between the first portion and the second portion to realize the temperature exchange between the first portion and the second portion. Thus, the internal temperature of the accommodation device may be adjusted. Further, the internal temperature of the accommodation device may be adjusted to change the air pressure of the accommodation device.

In some embodiments, the control device may control the first conversion device according to the parameter that indicates the air pressure of the accommodation space collected by the collection device. The control device controlling the first conversion device may include controlling the heat transfer medium inside the first conversion device to flow circularly to adjust the temperature of the first portion. For example, when the heat transfer medium inside the first conversion device is still and does not flow, the control device may control the heat transfer medium inside the first conversion device to flow according to the parameter to adjust the temperature of the first portion in the first conversion device. Thus, the efficiency of the first gas converting to the first liquid may be adjusted. Further, the air pressure inside the accommodation space may be adjusted. In some embodiments, the control device may control the flow speed of the heat transfer medium.

The control device controlling the first conversion device may further include controlling the temperature of the second portion in the first conversion device to adjust the temperature of the first temperature. The control device may adjust the temperature of the first portion inside the accommodation device by adjusting the temperature of the second portion outside of the accommodation device and controlling the heat transfer medium to flow. For example, the control device may control the temperature of the first portion to increase or the temperature of the first portion to adjust the efficiency of the first gas converting to the first liquid.

The heat transfer medium may include any liquid that can flow.

The heat transfer medium may be a liquid that converts to the gas when satisfying the third temperature condition. For example, the heat transfer medium may be liquid at a lower temperature. As the heat transfer medium flows, the temperature of the heat transfer medium may be increased. When the temperature of the heat transfer medium reaches the third temperature condition, the liquid may convert to the gas. The gas may continue to move inside the first conversion device until the temperature of the gas is decreased. The gas may convert to the liquid. As such, heat absorption and heat dissipation may be realized by gas-liquid transformation inside the first conversion device. The first conversion device may include a heat pipe.

The heat dissipation system of embodiments of the present disclosure includes the accommodation device, the collection device, and the control device. The accommodation device stores the first liquid. The first liquid may convert to the first gas when satisfying the first temperature condition. The electronic apparatus may be arranged in the first liquid. The first liquid may not affect the operation of the electronic apparatus and may convert to the first gas through the heat generated by the electronic apparatus during operation. The first temperature condition may change as the air pressure in the accommodation device changes. The collection device may be configured to collect the parameter that indicates the air pressure in the accommodation device. The control device may be configured to determine and execute the control instruction according to the parameter. The control instruction may include the instruction used to adjust the air pressure in the accommodation device. The heat dissipation system of embodiments of the present disclosure may adjust the change of the air pressure in the accommodation device through the control device. The accommodation device stores the first liquid. By arranging the electronic apparatus that needs the heat dissipation in the first liquid, the first liquid may absorb the heat of the electronic apparatus to convert to the first gas. Thus, the heat of the electronic apparatus may be dissipated. Since the control device may be configured to adjust the air pressure in the accommodation device, the problem that the efficiency of the first liquid absorbing the heat to convert to the first gas due to the change of the air pressure in the accommodation device decreases may be avoided. Thus, the efficiency of the heat transfer may be ensured.

Figure 8:
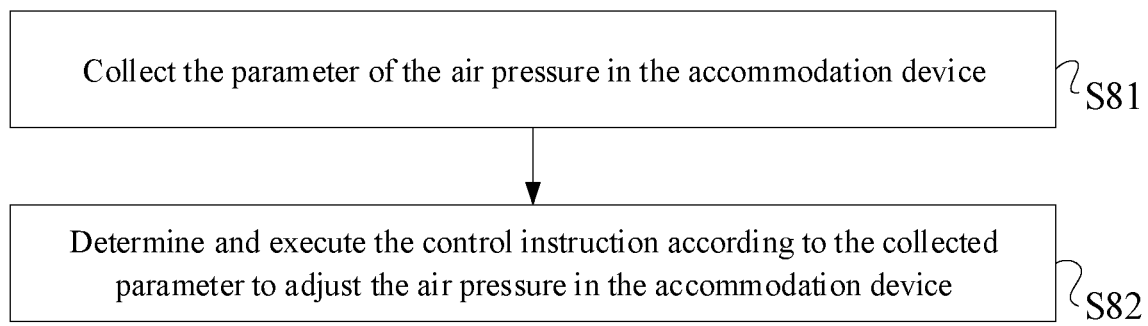
FIG. 8 illustrates a schematic flowchart of a heat dissipation method according to some other embodiments of the present disclosure.

Embodiments of the present disclosure provide a heat dissipation method. FIG. 8 illustrates a schematic flowchart of the heat dissipation method according to some other embodiments of the present disclosure.

At S81, the parameter of the air pressure in the accommodation device is collected. The accommodation device stores the first liquid. The first liquid may convert to the first gas when satisfying the first temperature condition. The electronic apparatus may be arranged in the first liquid. The first liquid may not affect the operation of the electronic apparatus and may convert to the first gas through the heat generated by the electronic apparatus during operation. The first temperature condition may change as the air pressure in the accommodation device changes.

At S82, the control instruction may be determined and executed according to the collected parameter to adjust the air pressure in the accommodation device.

The electronic apparatus may be the apparatus that needs heat dissipation. The electronic apparatus may be arranged in the first liquid. The first liquid may not affect the normal operation of the electronic apparatus. In some embodiments, the first liquid may have the insulation property and may not affect the electronic apparatus. In some other embodiments, the electronic apparatus includes the sealed housing. The sealed housing may block the first liquid from entering the electronic apparatus. Thus, the first liquid may not contact the electronic apparatus.

The first liquid may convert to the first gas when satisfying the first temperature condition. The first temperature condition may change as the air pressure in the accommodation device changes. That is, the air pressure in the accommodation device changes, then, the first temperature condition may change with. For example, when the air pressure of the accommodation device is first air pressure, the first liquid may convert to the first gas at the first temperature. When the air pressure of the accommodation device is second air pressure, the first liquid may convert to the first gas at a second temperature. The first temperature and the second temperature are the first temperature conditions under different air pressure conditions.

The accommodation device may store the first liquid. The accommodation device may include a sealed chamber or an opening. The accommodation device may be connected to and sealed from the outside through the opening. Thus, after changing into the first gas in the accommodation device, the first liquid may not be exhausted but may be still in the sealed space where the accommodation device is located.

The electronic apparatus is arranged in the first liquid. As shown in FIG. 2, the heat dissipation system includes the accommodation device 21, the first liquid 22, the electronic apparatus 23, and the collection device 24.

If the temperature of the electronic apparatus that needs heat dissipation is relatively high, the first liquid may reach the first temperature condition under the corresponding air pressure, and the first liquid may convert to the first gas. That is, the first liquid may convert to the first gas through the heat generated by the electronic apparatus during operation. After converting to the first gas, the first liquid may absorb the heat generated by the electronic apparatus during operation to lower the temperature of the electronic apparatus to dissipate the heat of the electronic apparatus.

By adjusting the air pressure in the accommodation device, the first temperature condition may be changed, and the efficiency of the first liquid converting to the first liquid may be changed. Thus, the efficiency of the heat dissipation of the electronic apparatus may be ensured. For example, by increasing the air pressure in the accommodation device, the boiling point of the first liquid converting to the gas may be increased in the first temperature condition. Thus, when converting to the first gas, the first liquid may absorb more heat from the electronic apparatus to increase the efficiency of heat dissipation. By decreasing the air pressure in the accommodation device, the boiling point of the first liquid converting to the gas may be lowered in the first temperature condition. Thus, when converting to the first gas, the first liquid may absorb less heat from the electronic apparatus to decrease the efficiency of heat dissipation.

Further, the first gas may convert to the first liquid when satisfying the second temperature condition. Under the same air pressure condition, the second temperature condition may be of lower temperature than the first temperature condition. The second temperature condition may change as the air pressure in the accommodation device changes.

The heat dissipation method of embodiments of the present disclosure is based on the heat dissipation system. The heat dissipation system further includes a first conversion device. The first conversion device is arranged inside the accommodation device and may be configured to provide the temperature that satisfies the second temperature condition. If the first gas gets close to or contacts the first conversion device, the first gas may convert to the first liquid.

The first liquid may convert to the first gas when satisfying the first temperature condition, and the first gas may convert to the first liquid by satisfying the second temperature condition. Under the same air pressure, the second temperature condition may be of lower temperature than the first temperature condition. For example, under the first air pressure condition, the first liquid may convert to the first gas when reaching the first temperature, and the first gas may convert to the first liquid when reaching the second temperature. The second temperature is lower than the first temperature. Under the second air pressure condition, the first liquid may convert to the first gas when reaching the third temperature, and the first gas may convert to the first liquid when reaching the fourth temperature. The fourth temperature may be lower than the third temperature.

The electronic apparatus is arranged in the first liquid. When reaching the first temperature condition by the heat generated during the operation of the electronic apparatus, the first liquid may convert to the first gas. As the first liquid converts to the first gas, the first liquid becomes less and less. To avoid this problem, the first conversion device, which is configured to cause the first gas to convert to the first liquid, is arranged in the accommodation device.

The first conversion device is arranged in the accommodation device. The first conversion device may be configured to cause the first gas to reach the second temperature condition. In some embodiments, the first conversion device causing the first gas to reach the second temperature condition includes the following process. The first conversion device may reach a certain temperature condition. When contacting the first conversion device, the first gas may reach the second temperature condition. In some other embodiments, the first conversion device may radiate a temperature satisfying a certain temperature condition. Thus, when getting close to the first conversion device, the first gas may reach the second temperature condition to convert to the first gas.

In some embodiments, the accommodation device may include a first side portion. The first side portion may be a side portion covered by the first liquid after the accommodation device stores the first liquid. The first conversion device may be arranged away from the first side portion and contactless from the first liquid.

The accommodation device may be configured to store the first liquid. Due to gravity, a side where the first liquid is located is a bottom side of the accommodation device. That is, a side where a bottom surface is located. Thus, after the accommodation device stores the first liquid, the first side portion covered by the first liquid may be the side where the bottom surface of the accommodation device is located.

Since the first liquid absorbs the heat dissipated by the electronic apparatus to convert to the first gas, after the first liquid converts to the first gas, the first gas may move toward an upper portion of the accommodation device. The first conversion device may be configured to transform the first gas into the first liquid. Thus, the first conversion device may not need to contact the first liquid and may be arranged at the upper portion of the accommodation device, that is, a position away from the first side portion.

As shown in FIG. 4, the heat dissipation system includes the accommodation device 41, the first liquid 42, the electronic apparatus 43, and the first conversion device 44. The first liquid is located at the bottom of the accommodation device. The first conversion device is located at the position of the upper portion of the accommodation device.

The first liquid is located at the bottom of the accommodation device due to gravity. The first gas that is formed after the first liquid satisfies the first temperature condition may move toward an opposite direction of the gravity direction, that is, toward the first conversion device. The first gas may convert to the first liquid after getting close to or contact the first conversion device, which satisfies the second temperature condition. The first gas may be transformed into the first liquid and move toward the first side portion. That is, the first liquid may drop to the bottom of the accommodation device due to gravity.

Further, the heat dissipation method of embodiments of the present disclosure is based on the heat dissipation system. The heat dissipation system further includes a valve. The valve may be arranged at the first opening. The accommodation device includes the first opening. The first opening may be arranged away from the first side portion. The valve may include a first state and a second state. In the first state, the accommodation device may be a sealed chamber. In the second state, the accommodation space of the accommodation device may communicate with the external space through the first opening.

The heat dissipation system may determine and execute the control instruction according to the parameter to control the valve. If the air pressure of the accommodation space is higher than the target air pressure, the control device may control the valve to be in the second state. Thus, the first gas inside the accommodation space may be exhausted through the first opening. If the air pressure of the accommodation space is lower than the target air pressure, the control device may control the valve to be in the second state. Thus, the second gas in the external space may be added into the accommodation space through the first opening.

The accommodation device includes the first opening. The first opening may cause the accommodation space of the accommodation device to communicate with the external space. The first opening may be configured to exchange the gas in, exhaust the gas from, or add the gas to the accommodation space. Since the first gas transformed from the first liquid moves to the opposite side of the gravity, that is, to the upper portion of the accommodation device, the first opening may be arranged at a side of the accommodation device opposite to the gravity. That is, the first opening may be arranged away from the first side portion. The first opening may be arranged at a position of the accommodation device away from the first side portion.

The valve may be arranged at the first opening. Thus, when the valve is in the first state, that is, the valve is turned off, the accommodation space of the accommodation device may be a sealed chamber. When the valve is in the second state, that is, the valve is turned on, the accommodation space may communicate with the external space through the first opening.

When the air pressure in the accommodation space does not need to be adjusted, that is, when the control device detects that the parameter indicating the air pressure of the accommodation space matches the target air pressure, the valve may be in the first state. Thus, the accommodation space may maintain sealed.

When the collection device collects the parameter of the air pressure in the accommodation space, the control device may adjust the air pressure in the accommodation space based on the parameter. In some embodiments, the control device may adjust the air pressure of the accommodation space by turning the valve on or off.

In some embodiments, the collection device may detect the parameter that indicates the air pressure in the accommodation space. Based on the parameter, the control device may compare the parameter to the target air pressure. If the control device determines that the parameter is higher than the target air pressure, the air pressure in the current accommodation space is higher. The boiling point of the first liquid in the accommodation space may rise, that is, the first temperature condition may be increased. The efficiency of the first liquid absorbing the heat radiated during the operation of the electronic apparatus may be increased. Therefore, the air pressure in the accommodation space may need to be decreased to decrease the first temperature condition to cause the air pressure in the accommodation space to match the target air pressure. Thus, the efficiency of the heat dissipation may be decreased, and the efficiency of the heat dissipation may match the heat radiated by the electronic apparatus to prevent an explosion.

In addition, if the control device determines that the parameter is lower than the target air pressure, the air pressure in the current accommodation space may be lower. The boiling point of the first liquid in the accommodation space may be lowered, that is, the first temperature condition is lowered. The efficiency of the first liquid absorbing the heated radiated during the operation of the electronic apparatus may be decreased. Thus, the air pressure in the accommodation space may be increased to cause the air pressure in the accommodation space to match the target air pressure. Thus, the first temperature condition may be increased to increase the efficiency of the heat dissipation to cause the efficiency of the heat dissipation to match the heat radiated by the electronic apparatus.

To decrease the air pressure in the accommodation space, the control device may need to control the valve to be turned on to cause the valve to be in the second state. Thus, the first gas in the accommodation space may be exhausted through the first opening. That is, the air pressure of the accommodation space may be increased, the gas in the accommodation space may be exhausted, and the air pressure may be then decreased.

To increase the air pressure in the accommodation space, the control device may need to control the valve to be turned on to cause the valve to be in the second state. Thus, second gas may be added from the external space into the accommodation space through the first opening. That is, the air pressure of the accommodation space may be decreased, the gas may be added into the accommodation space, and the air pressure in the accommodation space may be then increased.

The accommodation space may only include the first gas transformed from the first liquid or may include the first gas transformed from the first liquid and another gas that exists in the accommodation space, such as air. The second gas added to the accommodation space may be the same as or different from the first gas.

If the second gas is the same as the first gas, the heat dissipation system may further include a gas storage device.

The gas storage device may be configured to store the second gas that is exhausted from or to be added to the accommodation space through the first opening. That is, the external space from where the second gas is added into the accommodation space through the first opening may be the gas storage device. The first gas in the accommodation space may also be exhausted to the gas storage device through the first opening. The gas storage device may be only configured to store the gas. Thus, according to the needs of the accommodation space, the gas storage device may receive the exhaust gas or add the gas to the accommodation space.

If the second gas is different from the first gas, the second gas of an external environment may be added into the accommodation space through the first opening. The second gas may include air or another gas. No matter what gas is the second gas, the second gas will not react with the first gas.

In addition, if the second gas is different from the first gas, and the density of the second gas is smaller than the first gas, the accommodation device may be fixed in the heat dissipation system, the first liquid may be at the bottom of the accommodation chamber, and the first opening may be arranged at the top of the sealed chamber. If the air pressure of the accommodation space is lower than the target air pressure, the control device may control the valve to be in the second state to cause the second gas to be added to the accommodation space and to be at the top of the accommodation space. If the air pressure of the accommodation space is higher than the target air pressure, the control device may control the valve to be in the second state to cause the second gas at the top of the accommodation space to be exhausted through the first opening.

The bottom of the accommodation chamber may be the side portion of the accommodation chamber where the first liquid is located due to gravity. The top of the accommodation chamber may be the side portion opposite to the bottom in the accommodation chamber where the first gas may move due to anti-gravity after the first liquid converts to the first gas. As shown in FIG. 6, the heat dissipation system includes the accommodation device 61, the first liquid 62, the electronic apparatus 63, the valve 64, the first gas 65, and the second gas 66.

The first gas and the second gas have different densities, and the density of the second gas is smaller than the density of the first gas. Thus, if the accommodation chamber includes both the first gas and the second gas, the second gas is located at the top of the accommodation chamber, and the first gas is located under the second gas.

After the first liquid absorbs the heat of the electronic apparatus to convert to the first gas, the first gas moves to the top of the accommodation chamber. If the accommodation chamber includes the second gas, the second gas may be located at the top of the accommodation chamber. Thus, the first gas transformed from the first liquid may be under the second gas and may not reach the top of the accommodation chamber. If the accommodation chamber does not include the second gas, the first gas transformed from the first liquid may directly reach the top of the accommodation chamber.

If the control device detects that the parameter indicating the air pressure collected by the collection device is lower than the target air pressure, that is, the air pressure of the accommodation space is lower than the target air pressure, the control device may control the valve to be turned on, that is, in the second state. The second gas may be added to the accommodation space. The first opening of the accommodation chamber may be arranged at the top of the accommodation chamber. The second gas may enter the accommodation space through the first opening to directly reach the top of the accommodation space. Since the density of the second gas is smaller than the density of the first gas, the second gas may be maintained at the top of the accommodation space, no matter whether there is the second gas in the accommodation space at the moment.

If the control device detects that the parameter is higher than the target air pressure, that is, the air pressure of the accommodation space is higher than the target air pressure, the control device may control the valve to be turned on, that is, in the second state. The gas in the accommodation space may be exhausted through the first opening. In some embodiments, if there is the second gas in the accommodation space at the moment, since the density of the second gas is smaller than the density of the first gas, and the first opening is arranged at the top of the accommodation space, when the gas is exhausted, the second gas may be exhausted at first. After the second gas is exhausted, the first gas in the accommodation space may be exhausted through the first opening, which may reduce the amount of the first gas that is exhausted. Thus, the loss of the first gas may be reduced, and transformation between the first gas and the first liquid may be ensured. If the air pressure of the accommodation space is higher than the target air pressure, and the accommodation space does not include the second gas, the first gas may be directly exhausted.

Further, the heat dissipation method of embodiments of the present disclosure is based on the heat dissipation system. The heat dissipation system further includes the air-flow control device.

The air-flow control device may be configured to exhaust the first gas of the accommodation space or add the second gas to the accommodation space.

The air-flow control device may control exhausting or adding the gas. That is, the air-flow control device may control the flow direction of the gas whether to flow into the accommodation space or flow from the accommodation space to the outside.

In addition, the air-flow control device may be further configured to control the speed of exhausting the gas from the accommodation space or the speed of adding the gas to the accommodation space.

In some embodiments, the air-flow control device may include a pump or a fan. The air-flow control device may be configured to control the speed of adding the gas or exhausting the gas.

Further, in some embodiments, the accommodation chamber may include one or two first openings.

In some embodiments, the accommodation chamber may include one first opening. The first gas in the accommodation space may be exhausted through the one first opening. In addition, the second gas may be added to the accommodation space through the one first opening. That is, both adding the gas to the accommodation space and exhausting the gas from the accommodation space may be realized through the one first opening. The less the opening the accommodation device is, the better the air sealability is.

If the accommodation chamber includes two first openings, the first gas in the accommodation space may be exhausted from one of the first openings, and the second gas may be added to the accommodation space from the other first opening. That is, the opening for exhausting the gas may be differentiated from the opening for adding the gas. Thus, when the second gas is different from the first gas, the gas that is exhausted and the gas that is added may be differentiated to ensure a single exhaust gas composition to reduce another component in the exhaust gas.

Further, the heat dissipation method of embodiments of the present disclosure is based on the heat dissipation system. The heat dissipation system further includes the second conversion device.

The second conversion device may be arranged at a channel connecting the accommodation space and the external space. The second conversion device may be configured to transform the first gas exhausted through the first opening from the accommodation space into a third gas that satisfies the gas emission condition.

Satisfying the gas emission condition may include the gas emission standard that does not pollute the environment. The second conversion device may be configured to transform the gas exhausted from the accommodation space to cause the third gas after the transformation to satisfy the gas emission condition. Thus, the third gas may not pollute the environment and harm the human body.

The second conversion device may be arranged at a channel of the exhaust gas of the accommodation space, that is, the channel connecting the accommodation space and the external space, for example, a side of the first opening that is not adjacent to the accommodation space. In some embodiments, the second conversion device may be arranged at a position of the channel of the exhaust gas adjacent to the external space. In some other embodiments, the second conversion device may be arranged at any position of the channel of the exhaust gas.

Further, the accommodation device may include the sealed space. The heat dissipation system may adjust the temperature of the first conversion device according to the parameter to adjust the first temperature condition and the second temperature condition.

If the accommodation device includes the sealed space, by adjusting the internal temperature of the sealed accommodation space, the efficiency of the first gas converting to the first liquid may change. The change of the efficiency of the first gas converting to the first liquid may cause the air pressure in the sealed accommodation space to change. When the air pressure in the sealed space changes, the first temperature condition and the second temperature condition may change as the air pressure changes. The change of the temperature conditions may further affect the transformation efficiency between the gas and the liquid to cause the air pressure in the sealed space to match the target air pressure.

The internal temperature of the sealed accommodation space may be adjusted by adjusting the temperature of the gas in the sealed accommodation space. The temperature of the gas in the accommodation space may be adjusted by adjusting the temperature of the first conversion device. Thus, the temperature of the first conversion device may be adjusted according to the parameter that indicates the air pressure of the accommodation space collected by the collection device. Then, the first temperature condition and the second temperature condition may be adjusted to adjust the air pressure in the accommodation space.

Further, the heat dissipation method of embodiments of the present disclosure is based on the heat dissipation system. The heat dissipation system further includes the second opening. The second opening may be arranged at a position away from the first side portion.

The first conversion device may include the first portion and the second portion. The first portion may be located inside the accommodation device. The second portion may be located outside of the accommodation device. The second portion may be sealed and communicate with the first portion through the second opening. The first conversion device may include the heat transfer medium. The heat transfer medium may be inside the first conversion device. The heat transfer medium may flow circularly between the first portion and the second portion to cause the first portion to match the second temperature condition.

As shown in FIG. 7, the heat dissipation system includes the accommodation device 71, the first liquid 72, the electronic apparatus 73, the first opening 74, the second opening 75, and the first conversion device 76.

The first conversion device may be arranged through the second opening. A portion of the first conversion device may be inside the accommodation device. A portion of the first conversion device may be outside of the accommodation device. The heat transfer medium inside the first conversion device may flow circularly between the first portion and the second portion to realize the temperature exchange between the first portion and the second portion. Thus, the internal temperature of the accommodation device may be adjusted. Further, the internal temperature of the accommodation device may be adjusted to change the air pressure of the accommodation device.

In some embodiments, the control device may control the first conversion device according to the parameter that indicates the air pressure of the accommodation space collected by the collection device. The control device controlling the first conversion device may include controlling the heat transfer medium inside the first conversion device to flow circularly to adjust the temperature of the first portion. For example, when the heat transfer medium inside the first conversion device is still and does not flow, the control device may control the heat transfer medium inside the first conversion device to flow according to the parameter to adjust the temperature of the first portion in the first conversion device. Thus, the efficiency of the first gas converting to the first liquid may be adjusted. Further, the air pressure inside the accommodation space may be adjusted. In some embodiments, the control device may control the flow speed of the heat transfer medium.

Controlling the first conversion device may further include controlling the temperature of the second portion in the first conversion device to adjust the temperature of the first temperature. The control device may adjust the temperature of the first portion inside the accommodation device by adjusting the temperature of the second portion outside of the accommodation device and controlling the heat transfer medium to flow. For example, the control device may control the temperature of the first portion to increase or the temperature of the first portion to adjust the efficiency of the first gas converting to the first liquid.

The heat transfer medium may include any liquid that can flow.

The heat transfer medium may be the liquid that converts to the gas when satisfying the third temperature condition. For example, the heat transfer medium may be the liquid at a lower temperature. As the heat transfer medium flows, the temperature of the heat transfer medium may be increased. When the temperature of the heat transfer medium reaches the third temperature condition, the liquid may convert to the gas. The gas may continue to move inside the first conversion device until the temperature of the gas is decreased. The gas may convert to the liquid. As such, heat absorption and heat dissipation may be realized by gas-liquid transformation inside the first conversion device. The first conversion device may include a heat pipe.

The heat dissipation method of embodiments of the present disclosure includes collecting the parameter of the air pressure in the accommodation device and determining and executing the control instruction according to the parameter to adjust the air pressure in the accommodation device. The accommodation device stores the first liquid. The first liquid may convert to the first gas when satisfying the first temperature condition. The electronic apparatus may be arranged in the first liquid. The first liquid may not affect the operation of the electronic apparatus and may convert to the first gas through the heat generated by the electronic apparatus during operation. The first temperature condition may change as the air pressure in the accommodation device changes. The heat dissipation method of embodiments of the present disclosure includes storing the first liquid in the accommodation device. By arranging the electronic apparatus that needs the heat dissipation in the first liquid, the first liquid may absorb the heat of the electronic apparatus to convert to the first gas. Thus, the heat of the electronic apparatus may be dissipated. Since the control device may be configured to adjust the air pressure in the accommodation device, the problem that the efficiency of the first liquid absorbing the heat to convert to the first gas due to the change of the air pressure in the accommodation device decreases may be avoided. Thus, the efficiency of the heat transfer may be ensured.

Various embodiments in this specification are described in a progressive manner. Each embodiment focuses on the differences from other embodiments, and the same or similar parts between the various embodiments may be referred to each other. The device disclosed in embodiments of the present disclosure corresponds to the method disclosed in embodiments of the present disclosure. The description is relatively simple, and the relevant parts can refer to the description of the method part.

Those skilled in the art may further realize that the units and algorithm steps of the examples described in embodiments of the present disclosure may be implemented by electronic hardware, computer software, or a combination thereof. To clearly illustrate the interchangeability of hardware and software, in the above specification, the composition and steps of the examples have been generally described in accordance with the function. Whether these functions are performed by hardware or software depends on the specific application and design constraint conditions of the technical solution. Those skilled in the art may use different methods for each specific application to implement the described functions, but such implementation should not be considered beyond the scope of the present disclosure.

The steps of the method or algorithm described in combination with embodiments of the present disclosure may be directly implemented by hardware, a software module executed by a processor, or a combination thereof. The software module may be arranged in random access memory (RAM), internal memory, read-only memory (ROM), electrically programmable ROM, electrically erasable programmable ROM, a register, hard disks, removable disks, CD-ROMs, or any another storage medium known in the art.

The above description of embodiments of the present disclosure enables those skilled in the art to implement or use the present disclosure. Various modifications to embodiments of the present disclosure are obvious to those skilled in the art. The general principles defined in the present disclosure can be implemented in other embodiments without departing from the spirit or scope of the present disclosure. Therefore, the present disclosure is not limited to embodiments of the present disclosure, but should conform to the widest scope consistent with the principles and novel features of the present disclosure.

What is claimed is:

1. A heat dissipation system, comprising:
    an accommodation device storing a first liquid, the first liquid converting to a first gas in response to satisfying a first temperature condition, wherein an electronic apparatus is arranged in the first liquid, the first liquid does not affect an operation of the electronic apparatus and converts to the first gas through heat generated by the electronic apparatus, and the first temperature condition changes as a pressure in the accommodation device changes;
    a collection device configured to collect a parameter that indicates the pressure in the accommodation device;
    a first conversion device arranged in the accommodation device and configured to generate a temperature that satisfies a second temperature condition, the first gas converting to the first liquid in response to satisfying the second temperature condition, the second temperature condition being of lower temperature than the first temperature condition, and the second temperature condition changing as the pressure in the accommodation device changes; and
    a control device configured to determine and execute a control instruction according to the parameter, the control instruction including an instruction used to:
        adjust the pressure in the accommodation device, including:
            determining the temperature that satisfies the second temperature condition under the pressure indicated by the parameter; and
            controlling the first conversion device to generate the temperature determined to cause the first gas to convert to the first liquid in response to the first gas getting close to or contacting the first conversion device, to adjust the pressure in the accommodation device.

2. The heat dissipation system of claim 1, wherein:
    the accommodation device includes a first side portion, the first side portion being a side portion covered by the first liquid after the accommodation device stores the first liquid;
    the first conversion device is arranged away from the first side portion and does not contact the first liquid,
    the first gas formed after the first liquid satisfies the first temperature condition moves toward the first conversion device; and
    the first liquid formed after the first gas gets close to or contacts the first conversion device that satisfies the second temperature condition moves toward the first side portion.

3. The heat dissipation system of claim 1,
    wherein the accommodation device includes a first opening arranged away from the first side portion;
    the heat dissipation system further comprising:
        a valve arranged at the first opening, the valve including:
            a first state, the accommodation device being a sealed chamber in the first state; and a second state, an accommodation space of the accommodation device communicating with an external space through the first opening;
wherein:
the control device is configured to determine and execute the control instruction according to the parameter to control the valve;
in response to the pressure of the accommodation space being higher than a target pressure, the control device controls the valve to be in the second state to exhaust the first gas in the accommodation space through the first opening; and
in response to the pressure of the accommodation space being lower than the target pressure, the control device controls the valve to be in the second state to add a second gas of the external space into the accommodation space through the first opening.

4. The heat dissipation system of claim 3, wherein:
the second gas is different from the first gas, and a density of the second gas is smaller than a density of the first gas;
the accommodation device is fixed in the heat dissipation system, the first liquid is located at a bottom of the accommodation space, and the first opening is arranged at a top of the accommodation space;
in response to the pressure of the accommodation space being lower than the target pressure, the control device controls the valve to be in the second state to add the second gas to the accommodation space, the second gas being located at the top of the accommodation space; and
in response to the pressure of the accommodation space being higher than the target pressure, the control device controls the valve to be in the second state to exhaust the second gas at the top of the accommodation space through the first opening.

5. The heat dissipation system of claim 3, further comprising:
an air-flow control device, configured to control the first gas exhausted from the accommodation space or the second gas added to the accommodation space.

6. The heat dissipation system of claim 1, wherein:
the accommodation device is a sealed space; and
the control device is configured to adjust the temperature of the first conversion device according to the parameter to adjust the first temperature condition and the second temperature condition.

7. The heat dissipation system of claim 6, wherein:
the accommodation device includes a second opening arranged away from the first side portion;
the first conversion device includes:
a first portion, located inside the accommodation device;
a second portion, located outside of the accommodation device, the second portion being sealed and connected to the first portion through the second opening; and
a heat transfer medium, located inside the first conversion device and flowing circularly between the first portion and the second portion to cause the first portion to satisfy the second temperature condition; and
the control device is configured to control the first conversion device according to the parameter, the control device being configured to control the heat transfer medium inside the first conversion device to flow circularly to adjust a temperature of the first portion, or control a temperature of the second portion to adjust the temperature of the first portion.

8. The heat dissipation system of claim 7, wherein:
the heat transfer medium is a liquid.

9. The heat dissipation system of claim 7, wherein:
the heat transfer medium is a liquid that converts to a gas in response to satisfying a third temperature condition.

10. A heat dissipation method, comprising:
collecting a parameter of a pressure in an accommodation device, wherein:
the accommodation device is configured to store a first liquid;
the first liquid converts to a first gas in response to satisfying a first temperature condition;
in response to an electronic apparatus being arranged in the first liquid, the first liquid does not affect an operation of the electronic apparatus and converts to the first gas through heat generated by the electronic apparatus; and
the first temperature condition changes as the pressure in the accommodation device changes;
generating a temperature that satisfies a second temperature condition for a first conversion device, the first gas converting to the first liquid in response to satisfying the second temperature condition, the second temperature condition being of lower temperature than the first temperature condition, and the second temperature condition changing as the pressure in the accommodation device changes; and
determining and executing a control instruction according to the parameter to adjust the pressure in the accommodation device, including:
determining the temperature that satisfies the second temperature condition under the pressure indicated by the parameter; and
controlling the first conversion device to generate the temperature determined to cause the first gas to convert to the first liquid in response to the first gas getting close to or contacting the first conversion device, to adjust the pressure in the accommodation device.

11. The heat dissipation method of claim 10, wherein:
the first gas formed after the first liquid satisfies the first temperature condition moves toward the first conversion device; and
the first liquid formed after the first gas gets close to or contacts the first conversion device that satisfies the second temperature condition moves toward a first side portion, the first side portion being a side portion covered by the first liquid after the accommodation device stores the first liquid.

12. The heat dissipation method of claim 10,
wherein a first opening is arranged away from the first side portion at the accommodation device;
the heat dissipation method further comprising:
determining and executing the control instruction according to the parameter to control a valve, the valve being arranged at the first opening and including:
a first state, the accommodation device being a sealed chamber in the first state; and
a second state, an accommodation space of the accommodation device communicating with an external space through the first opening;

in response to the pressure of the accommodation space being higher than a target pressure, controlling the valve to be in the second state to exhaust the first gas in the accommodation space through the first opening; and in response to the pressure of the accommodation space being lower than the target pressure, controlling the valve to be in the second state to add a second gas of the external space into the accommodation space through the first opening.

13. The heat dissipation method of claim 12, wherein:

the second gas is different from the first gas, and a density of the second gas is smaller than a density of the first gas; and the first liquid is located at a bottom of the accommodation space, and the first opening is arranged at a top of the accommodation space;

the heat dissipation method further comprising:

in response to the pressure of the accommodation space being lower than the target pressure, controlling the valve to be in the second state to add the second gas to the accommodation space, the second gas being located at the top of the accommodation space; and in response to the pressure of the accommodation space being higher than the target pressure, controlling the valve to be in the second state to exhaust the second gas at the top of the accommodation space through the first opening.

14. The heat dissipation method of claim 12, further comprising:

controlling the first gas exhausted from the accommodation space or the second gas added to the accommodation space.

15. The heat dissipation method of claim 10, further comprising:

adjusting the temperature of the first conversion device according to the parameter to adjust the first temperature condition and the second temperature condition.

16. The heat dissipation method of claim 15, further comprising:

controlling a heat transfer medium inside the first conversion device to flow circularly to adjust a temperature of a first portion of the first conversion device; or controlling a temperature of a second portion of the first conversion device to adjust the temperature of the first portion.

17. The heat dissipation method of claim 16, wherein:
the heat transfer medium is a liquid.

18. The heat dissipation method of claim 16, wherein:
the heat transfer medium is a liquid that converts to a gas in response to satisfying a third temperature condition.

* * * * *